Figure 1:
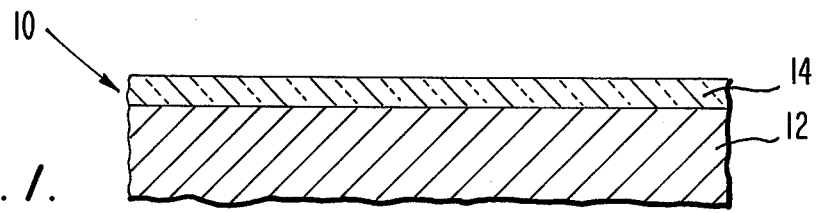

United States Patent [19]

Keller

[11] 4,090,915
[45] May 23, 1978

[54] FORMING PATTERNED POLYCRYSTALLINE SILICON

[75] Inventor: Kenneth Robert Keller, Chittenango, N.Y.

[73] Assignee: RCA Corporation, New York, N.Y.

[21] Appl. No.: 824,224

[22] Filed: Aug. 12, 1977

[51] Int. Cl.² .......................................... H01L 21/306
[52] U.S. Cl. ..................... 156/628; 148/187; 148/188; 156/657; 156/659; 156/662; 252/79.5
[58] Field of Search ................. 148/187, 188, 191; 156/628, 659, 662, 657; 252/79.5

[56] References Cited

U.S. PATENT DOCUMENTS

| | | | |
|---|---|---|---|
| 3,777,364 | 12/1973 | Schinella et al. | 29/578 |
| 3,832,247 | 8/1974 | Saddler et al. | 148/188 X |
| 4,057,895 | 11/1977 | Ghezzo | 156/628 X |
| 4,062,720 | 12/1977 | Alcorn et al. | 156/662 X |

Primary Examiner—William A. Powell
Attorney, Agent, or Firm—H. Christoffersen; T. H. Magee

[57] ABSTRACT

A method of forming patterned polycrystalline silicon having a rounded profile on a substrate comprises providing a defined source of one type conductivity modifiers adjacent the substrate where the silicon is to be formed, depositing a film of polycrystalline silicon over the defined source, diffusing the conductivity modifiers from the defined source into regions of the film adjacent thereto, and then contacting the entire surface of the film with a solvent in which the film is soluble but in which the regions doped with the one type conductivity modifiers are substantially insoluble, thereby removing regions of the film that are substantially void of the one type conductivity modifiers.

9 Claims, 6 Drawing Figures

U.S. Patent    May 23, 1978    4,090,915

FORMING PATTERNED POLYCRYSTALLINE SILICON

This invention relates to a method of forming patterned polycrystalline silicon having a rounded profile on a substrate.

Deposited layers of polycrystalline silicon are used in integrated circuit devices as the material of conductors and resistors. These deposited layers ordinarily overlie insulating material, which may be silicon dioxide and/or silicon nitride formed as a coating on a body of silicon, or may be sapphire in the so-called silicon-on-sapphire (SOS) technology. One example of the use of polycrystalline silicon as a conductor is in self-aligned gate metal-oxide-semiconductor (MOS) devices, in which a polycrystalline silicon layer of defined shape serves as a gate electrode. Polycrystalline silicon is also used for fabricating polycrystalline silicon interconnects utilized for electrically connecting various active and passive elements disposed on the same integrated circuit chip.

In many known devices, including the silicon gate devices, deposited polycrystalline silicon conductors overlie an insulating coating, usually of silicon dioxide, on a device wafer. Typically, the silicon has been deposited as an intrinsic film; the portions of the film intended to remain have been masked off with an etch resistant mask; and the unmasked portions of the film have been etched away. Subsequently, the remaining portions of the film are doped to render them conductive. The doping process when done conventionally produces a silicate glass film on the silicon and on the exposed silicon dioxide insulator. This film is usually removed by etching in a suitable solvent, and most common solvents will also attack the underlying silicon dioxide layer, a similarly constituted material. Yield losses occur when the solvent attacks weak spots in the silicon dioxide layer, producing pinholes.

Another known method of defining the shape of a polycrystalline silicon layer is disclosed in U.S. Pat. No. 3,738,880, issued to A. Laker on June 12, 1973, and assigned to RCA Corporation. In this method, portions of a layer of polycrystalline silicon are doped by diffusion to a relatively high degree of P type conductivity with boron. The entire layer is then contacted with a selective solvent to remove the undoped material. This method is satisfactory for its intended purpose but does not result in defined layers which are larger than their designed size and in which the edtes tend to overhang, that is the layer tends to be wider at the top than at the bottom. This is the result of the masked diffusion process which is employed to render the retained material P type. Side diffusion will enlarge the P type region relative to the size of the mask opening. The shape of the diffusion front will produce the overhanging edges.

In order to improve control of the size of the retained material and of the edge shape, another known method of making a patterned polycrystalline silicon layer in a semiconductor device is disclosed in U.S. Pat. No. 3,980,507, issued to D. R. Carley on Sept. 14, 1976, and assigned to RCA Corporation. In this method, portions of a polycrystalline silicon layer disposed on an insulator are removed after diffusing donor impurities into and through the regions to be removed. The regions to be retained are either previously or simultaneously doped with acceptor impurities. Of importance is the fact that the material to be retained is defined geometrically by the introduction of donor impurities in the areas adjacent to it, so that the enlargement and edge shaping results of side diffusion which have taken place in the prior processes are avoided. The method provides improved control of the size and the shape of the edges of the retained regions. However, the major problem in the fabrication of polycrystalline silicon gate arrays and interconnects with good yield is maintaining metal continuity as the metal crosses over a polycrystalline silicon island. One approach has been to use a very thin polycrystalline silicon layer at the expense of an undesirable increase in resistance. The present invention provides a method of forming patterned polycrystalline silicon having a rounded profile which is highly suitable for utilization with metallic crossovers.

In the drawings:

FIGS. 1 through 6 are a series of cross-sectional views illustrating a succession of steps performed in the present novel method.

Figure 2:
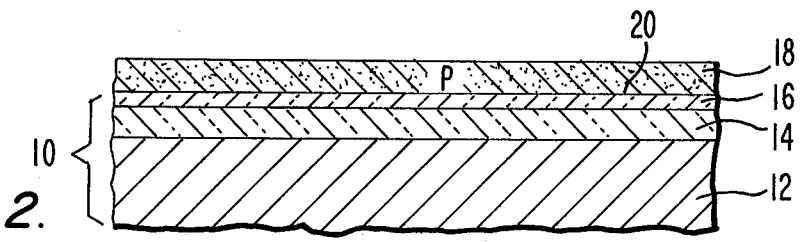

Referring to FIG. 1 of the drawings, there is shown a substrate 10 upon which patterned polycrystalline silicon having a rounded profile is formed in accordance with present novel method. Such a substrate 10 typically includes a semiconductor wafer having a thick field oxide thereon. In the present example, the substrate 10 comprises a silicon wafer 12 having a layer 14 of silicon dioxide thereon, and preferably a further layer 16 of silicon nitride over the silicon dioxide layer 14, as shown in FIG. 2. The layer 14 may be thermally grown or may be deposited using conventionally known techniques. The silicon nitride layer 16 is deposited over the oxide layer 14 and serves as a diffusion mask which prevents the diffusion of conductivity modifiers into the underlying oxide layer 14 during subsequent processing steps described in further detail below. A layer of $Al_2O_3$ or any other material capable of serving as a diffusion barrier may be utilized in place of the silicon nitride layer 16. If the silicon dioxide 14 is sufficiently thick and a subsequently deposited doped layer is thin, such a diffusion-blocking layer may not be needed.

Figure 3:
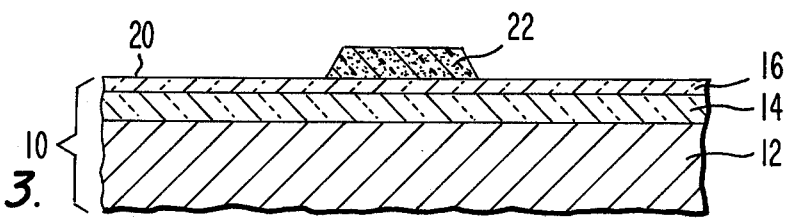

A defined source of one type conductivity modifiers is now provided adjacent the substrate 10 where the patterned polycrystalline silicon is to be formed. In the preferred embodiment, the step of providing the defined source is performed by first forming a layer 18 of material containing the one type conductivity modifiers on the surface 20 of the silicon nitride layer 16, as illustrated in FIG. 2. In the present example, this layer 18 is a deposited layer of silicon dioxide doped with P type conductivity modifiers. One way to form this P doped silicon dioxide layer 18 is to place the substrate 10 in a suitable furnace and expose the surface 20 to the vapors of silane ($SiH_4$), oxygen, and diborane ($B_2H_6$) at an elevated temperature. Ths process is known as chemical vapor deposition, and such techniques are discussed in detail, for example, in U.S. Pat. No. 3,481,781, issued to W. Kern on Dec. 2, 1969, and assigned to RCA Corporation. After forming this doped layer 18, it is selectively defined so that only a portion 22 of the layer 18 remains where the patterned polycrystalline silicon is to be formed. This defining step is typically performed by utilizing conventional photolithographic processes so that only the portion 22 of the doped silicon dioxide layer 18 remains, as shown in FIG. 3. Using known oxide etching techniques, the profile of the portion 22 can be suitably shaped so as to insure adequate and uniform coverage by a subsequently deposited film of polycrystalline silicon. Other sources of conductivity modifiers may be, for example, boron trioxide ($B_2O_3$), a gallium trioxide ($Ga_2O_3$), phosphorus pentoxide ($P_2O_5$), and phosphorus nitride ($P_3N_5$).

Figure 4:
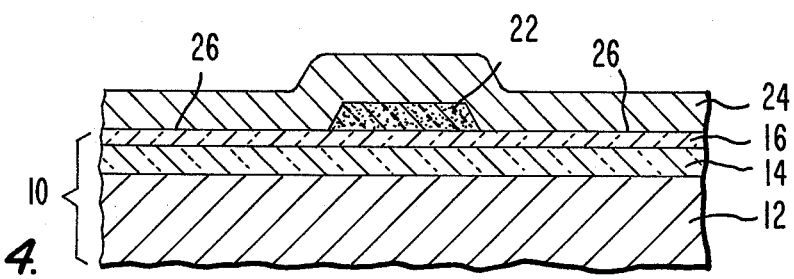
Figure 5:
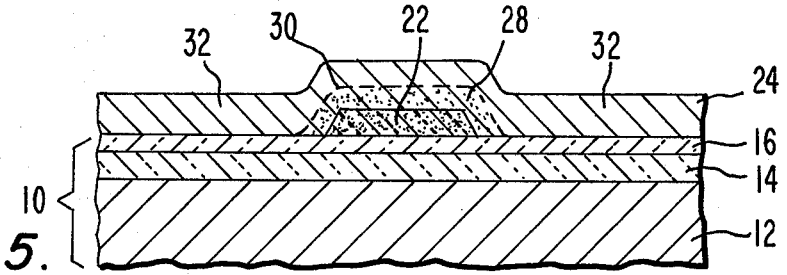

Next, a film 24 of polycrystalline silicon, substantially void of the one type conductivity modifiers, is deposited over the defined source. In the present embodiment, this depositing step is performed by depositing the polycrystalline silicon film 24 over the remaining portion 22 of the doped silicon dioxide layer 18 and over exposed sections 26 of the substrate 10, as illustrated in FIG. 4. The film 24 may be formed, for example, by the thermal decomposition of silane ($SiH_4$) diluted with hydrogen in the manner known in the preparation of silicon gate MOS devices. The polycrystalline silicon film 24 may have a thickness of approximately 8000A, and may be either substantially intrinsic or silicon containing N type conductivity modifiers.

After depositing the film 24 of polycrystalline silicon over the defined source, a heat treatment step is carried out to diffuse the one type conductivity modifiers, P type in the present example, from the defined source into regions 28 of the polycrystalline silicon film 24 adjacent thereto. This diffusing step is typically performed by heating the substrate 10 to a temperature at which the one type conductivity modifiers will diffuse from the remaining portion 22 of the doped silicon dioxide layer 18 into the adjacent regions 28 of the polycrystalline silicon film 24. This temperature, for example 900° C, is maintained until a desired redistribution of the one type conductivity modifiers is achieved, typically 30 minutes. The resulting diffused junction profile is a downward-sloping concave-shaped curve, illustrated in FIG. 5 as a dashed line 30. Thus, the use of the doped silicon dioxide portion 22 under the deposited polycrystalline silicon film 24 provides an inverted junction which becomes critical in the subsequent formation of the patterned polycrystalline silicon having a desirable rounded profile. During the diffusing step in the present example, the silicon nitride layer 16 acts as a barrier for restricting the diffusion of conductivity modifiers from the remaining portion 22 into the underlying field oxide layer 14.

Figure 6:
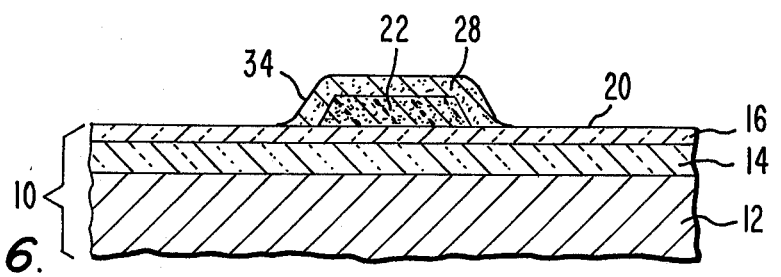

The next step is to contact the entire surface of the polycrystalline silicon film 24 with a solvent in which the film 24 is soluble but in which the regions 28 doped with the one type conductivity modifiers are substantially insoluble, for a time sufficient to remove the regions 32 of the film 24 that are substantially void of the one type conductivity modifiers. In embodiments wherein the polycrystalline silicon film 24 is N type silicon, regions 28 may be partially soluble in the solvent, but they should have a sufficiently high differential etch rate so as to maintain pattern integrity. In the present example wherein the one type conductivity is P type, the surface of the film 24 should be contacted with a solvent in which N type silicon or substantially intrinsic silicon is soluble but in which P type silicon is substantially insoluble, that is, the solvent does not vigorously attack the P doped silicon. The below solvents for silicon are selective for substantially intrinsic silicon, that is, they are solvents in which intrinsic silicon is relatively soluble but in which P doped silicon is substantially insoluble; N doped silicon, however, is relatively soluble. Suitable solvents are aqueous hydrazine solutions, aqueous potassium hydroxide solutions, aqueous ammonium hydroxide solutions, potassium hydroxide-propanol solutions, and the like. The entire silicon film 24 is exposed to one of these solvents for a time sufficient to remove the regions 32 of the film that are substantially void of the P type conductivity modifiers, whereby patterned polycrystalline silicon having a rounded exterior surface 34 is formed, as shown in FIG. 6. The terms "soluble" and "insoluble" as used herein are intended to mean relatively soluble and insoluble. As is known, doped polycrystalline silicon can be etched in the acidic solutions, for example. The rate of etching, however, is inversely proportional to the doping level, and highly doped material is extremely difficult to etch. Consequently, in the performance of the present method, the remaining portion 22 and the adjacent regions 28 should be relatively highly doped.

In one example of the present method, the solvent may be an aqueous solution of 64% hydrazine, by volume; the doping level of the adjacent regions 28 should be relatively highly-doped P type silicon. By relatively highly doped is meant here a surface concentration of a minimum of about $10^{16}$ atoms/cm$^3$. The diffusion processes used to form the adjacent regions 28 should therefore be carried out under conditions appropriate for achieving a doping level of this value or greater. As is known, the concentration of modifiers in a diffused region falls off exponentially from a maximum concentration at the surface through which the diffusion is carried out, and it is common to describe doping concentrations in terms of the surface concentration as is done here. Under these conditions, a good, rounded edge definition may be achieved.

The etching solutions described above for silicon do not attack silicon dioxide and silicon nitride to an appreciable extent. Therefore, the removal of the regions 32 of the film 24 that are substantially void of the P type conductivity modifiers is effectively self-limiting, that is, the etching will stop at the surface 20 of the silicon nitride layer 16. In the alternative to the present embodiment, if one provides a defined source of N type conductivity modifiers adjacent the substrate 10 and then deposits a film of P type polycrystalline silicon thereover, one would utilize an etchant which is selective for P type silicon but in which N type silicon is substantially insoluble.

The present novel invention discloses a method of forming patterned polycrystalline silicon on a substrate wherein, not only is an etch resistant mask not required, but also the resulting pattern of polycrystalline silicon has a rounded profile which is highly suitable for utilization with metallic crossovers. This very desirable rounded surface 34 results from the fact that the preferential solvent, as it etches the silicon, follows the inverted diffused junction, namely, the downward-sloping concave-shaped junction profile represented by the dashed line 30. Such a rounded profile significantly improves the yield in manufacturing polycrystalline silicon gate arrays and interconnects utilized in integrated circuit devices.

What is claimed is:

1. A method of forming patterned polycrystalline silicon having a rounded profile on a substrate comprising the steps of
providing a defined source of one type conductivity modifiers adjacent said substrate where said patterned polycrystalline silicon is to be formed,
depositing a film of polycrystalline silicon, substantially void of said one type conductivity modifiers, over said defined source, diffusing said one type conductivity modifiers from said defined source into regions of said film adjacent thereto, and contacting the entire surface of said film with a solvent in which said film is soluble but in which said regions doped with said one type conductivity modifiers are substantially insoluble, for a time sufficient to remove the regions of said film that are substantially void of said one type conductivity modifiers, whereby said patterned polycrystalline silicon having a rounded profile is formed.

2. A method as recited in claim 1 wherein said providing step is performed by forming a layer of material containing said one type conductivity modifiers on said substrate, and defining said layer selectively so that only a portion of said layer remains where said patterned polycrystalline silicon is to be formed.

3. A method as recited in claim 2 wherein said depositing step is performed by depositing said film over said remaining portion of said layer and exposed sections of said substrate.

4. A method as recited in claim 3 wherein said layer of material is doped silicon dioxide, and wherein said defining step is performed by photolithographically removing portions of said layer so that only the portion of said layer remains where said patterned polycrystalline silicon is to be formed.

5. A method as recited in claim 4 wherein said diffusing step is performed by heating said substrate to a temperature at which said one type conductivity modifiers will diffuse from said silicon dioxide into said regions of said film and maintaining said temperature until a desired redistribution of said one type conductivity modifiers is achieved.

6. A method as recited in claim 2 wherein said one type conductivity is P type, and wherein said solvent is selected from the group consisting of aqueous hydrazine, aqueous potassium hydroxide, aqueous ammonium hydroxide, and potassium hydroxide-propanol.

7. A method as recited in claim 6 wherein said film of polycrystalline silicon is substantially intrinsic silicon.

8. A method as recited in claim 6 wherein said film of polycrystalline silicon contains N type conductivity modifiers.

9. A method as recited in claim 2 wherein said substrate comprises a silicon wafer having a layer of silicon dioxide thereon, said silicon dioxide layer having a layer of silicon nitride thereover.

* * * * *